United States Patent
Kumagai et al.

(10) Patent No.: US 7,838,075 B2
(45) Date of Patent: Nov. 23, 2010

(54) SURFACE STRENGTHENING METHOD

(75) Inventors: Masao Kumagai, Tokyo (JP); Yoshio Jimbo, Kanagawa (JP); Fumiya Yakabe, Shizuoka (JP)

(73) Assignee: JATCO Ltd, Fuji-shi (JP)

( * ) Notice: Subject to any disclaimer, the term of this patent is extended or adjusted under 35 U.S.C. 154(b) by 722 days.

(21) Appl. No.: 11/480,584

(22) Filed: Jul. 5, 2006

(65) Prior Publication Data

US 2007/0009662 A1 Jan. 11, 2007

(30) Foreign Application Priority Data

Jul. 5, 2005 (JP) .............................. 2005-196160
Apr. 19, 2006 (JP) .............................. 2006-115991

(51) Int. Cl.
*B05D 3/12* (2006.01)

(52) U.S. Cl. ........................... 427/359; 72/324; 72/344; 72/364; 148/537; 148/624; 148/651; 148/902; 384/45; 384/492; 384/907.1; 427/318; 427/355

(58) Field of Classification Search .................. 427/359
See application file for complete search history.

(56) References Cited

U.S. PATENT DOCUMENTS

| | | | | |
|---|---|---|---|---|
| 4,258,084 A | * | 3/1981 | Hayden, Sr. | ................. 427/239 |
| 4,553,417 A | | 11/1985 | Badger | |
| 5,288,556 A | * | 2/1994 | Lemelson | .................... 428/408 |
| 5,881,594 A | * | 3/1999 | Hughes et al. | ................. 72/364 |
| 6,874,942 B2 | * | 4/2005 | Yamamoto et al. | .......... 384/492 |
| 7,111,395 B2 | * | 9/2006 | Sandner | ..................... 29/893.3 |
| 2003/0099416 A1 | * | 5/2003 | Kinno et al. | ................. 384/492 |
| 2005/0016444 A1 | * | 1/2005 | Franz et al. | .................... 117/68 |
| 2005/0213860 A1 | * | 9/2005 | Zhou | .......................... 384/492 |

FOREIGN PATENT DOCUMENTS

| EP | 0 573 722 A2 | 12/1993 |
|---|---|---|
| JP | 3212433 B2 | 7/2001 |
| JP | 2004-10923 A | 1/2004 |

OTHER PUBLICATIONS

Japanese Industrial Standard "High carbon chromium bearing steels", JIS G 4805 (1999) (pp. 1-31).

(Continued)

*Primary Examiner*—Michael Kornakov
*Assistant Examiner*—Alexander Weddle
(74) *Attorney, Agent, or Firm*—Foley & Lardner LLP

(57) ABSTRACT

A method for strengthening a surface of a metal member. The method includes the following steps in the sequence set forth: (a) coating the surface of the metal member with a carbon-based film having a thickness of not smaller than 0.2 μm; and (b) repeatedly applying a pressing force onto the surface of the film-coated metal member in a condition of maintaining a contact pressure of not lower than 2.5 GPa at the surface of the film-coated metal member.

7 Claims, 3 Drawing Sheets

OTHER PUBLICATIONS

Japanese Industrial Standard "Chromium Steels", JIS G 4104 (1979) (pp. 1-9).

Japanese Industrial Standard "Chromium Molybdenum Steels", JIS G 4105 (1979) (pp. 1-11).

V.M. Shlyakhovs, "Broach burnishing tube sizing—uses coolant fed along tube length with temp. on tube external surface in deformation zone below that of initial transformation", Database WPI Week 198329, Thomson Scientific, London, GB; AN 1983-715916 XP-002499604 & SU 958 016 A, Sep. 15 1982, 1 pg.

Masao Kumagai et al., "Improvement of Rolling Contact Fatigue by DLC Coating", Journal of the Surface Finishing Society of Japan, vol. 57, No. 6 (2006), pp. 428-433.

Yakabe Fumiya et al., "Influence of hard film on pitting resistance of carburized steel for gear wheel", Synopses of Tribology Symposium held under Japanese Society of Tribologist, vol. 11 (2005), pp. 65-66.

Yakabe Fumiya et al., "Surface fatigue of SCr 420 on which hard film is formed upon carburization", Synopses of Symposium held under the Japanese Society of Heat Treatment, vol. 16 (2005), pp. 3-4.

* cited by examiner

SURFACE STRENGTHENING METHOD

BACKGROUND OF THE INVENTION

This invention relates to improvements in a method for strengthening a surface of a metal member having a carbon-based film, in order to form a structure containing fine grains at the surface of the film-coated metal member thereby highly increase mechanical strength, wear resistance and the like.

In a metal member such as a machine part and the like, it is required to increase mechanical strength and wear resistance at a surface of a metal product or the metal member in accordance with design specifications of the metal product. Hence, conventional techniques have met the above requirement by making a heat treatment such as quenching, carburizing and nitriding on the metal member or by making a shot peening on the surface of the metal product, as disclosed in Japanese Patent Publication No. 3212433.

SUMMARY OF THE INVENTION

However, drawbacks have been encountered in the above conventional techniques, in which a large-scale facility is needed for carrying out any of the above-discussed treatments; and controlling a temperature and particle kinds of shots is troublesome, and a quality control for the metal product is difficult, so that a cost-saving cannot be achieved. Additionally, it is difficult to strengthen the metal member only at its specified portion. Particularly in the shot peening, there are the fears that a temperature is so increased under collision of shots as to temper and soften the metal product, and that a stable quality of the metal product cannot be maintained since the collision of shots makes the surface of the metal product rough.

It is, therefore, an object of the present invention to provide an improved surface strengthening method which can effectively overcome the drawbacks encountered in the above conventional techniques.

Another object of the present invention is to provide an improved surface strengthening method which effectively strengthens the surface of a metal member without using a large-scale facility and troublesome and difficult treatments.

An aspect of the present invention resides in a method for strengthening a surface of a metal member. The method includes the following steps in the sequence set forth: (a) coating the surface of the metal member with a carbon-based film having a thickness of not smaller than 0.2 μm; and (b) repeatedly applying a pressing force onto the surface of the film-coated metal member in a condition of maintaining a contact pressure of not lower than 2.5 GPa at the surface of the film-coated metal member.

Another aspect of the present invention resides in a method for strengthening a surface of a cylindrical metal member. The method comprises the following steps in the sequence set forth: (a) coating the surface of the cylindrical metal member with a DLC film having a thickness of not smaller than 0.2 μm; and (b) bringing a roller into press contact with the surface of the film-coated cylindrical metal member and rotating the roller so that a pressing force is repeatedly applied onto the surface of the film-coated cylindrical metal member in a condition of maintaining a Hertzian contact pressure of not lower than 2.5 GPa at the surface of the film-coated cylindrical metal member.

DETAILED DESCRIPTION OF THE INVENTION

According to the present invention, a method for strengthening a surface (or surface portion) of a metal member comprises the following steps in the sequence set forth: (a) coating the surface of the metal member with a carbon-based film having a thickness of not smaller than 0.2 μm; and (b) repeatedly applying a pressing force onto the surface of the film-coated metal member in a condition of maintaining a contact pressure of not lower than 2.5 GPa at the surface of the film-coated metal member.

In the surface strengthening method according to the present invention, the metal member whose surface (or surface portion) is to be strengthened is coated at its surface with a carbon-based film. This promotes formation of a microstructure in the metal member or a substrate and prevents the metal member from fatigue failure by virtue of the low friction and high strength characteristics of the carbon-based film. It is preferable that the carbon-based film has a coefficient of friction of lower than 0.6. Specifically, concrete examples of the carbon-based film are a DLC (Diamond Like Carbon) film and the like. Additionally, the carbon-based film is formed to have a thickness of not smaller than 0.2 μm from the view point of ensuring a wear resistance of the metal member.

Then, the pressing force is repeatedly applied to the film-coated metal member whose surface (portion) is to be strengthened, in such a manner that the surface of the film-coated metal member receives a contact pressure (Hertzian contact pressure) of not lower than 2.5 GPa. With this, a distortion larger than that in normal processing can be introduced into the metal member thereby forming the microstructure in the metal member.

Figures 1A, 1B:
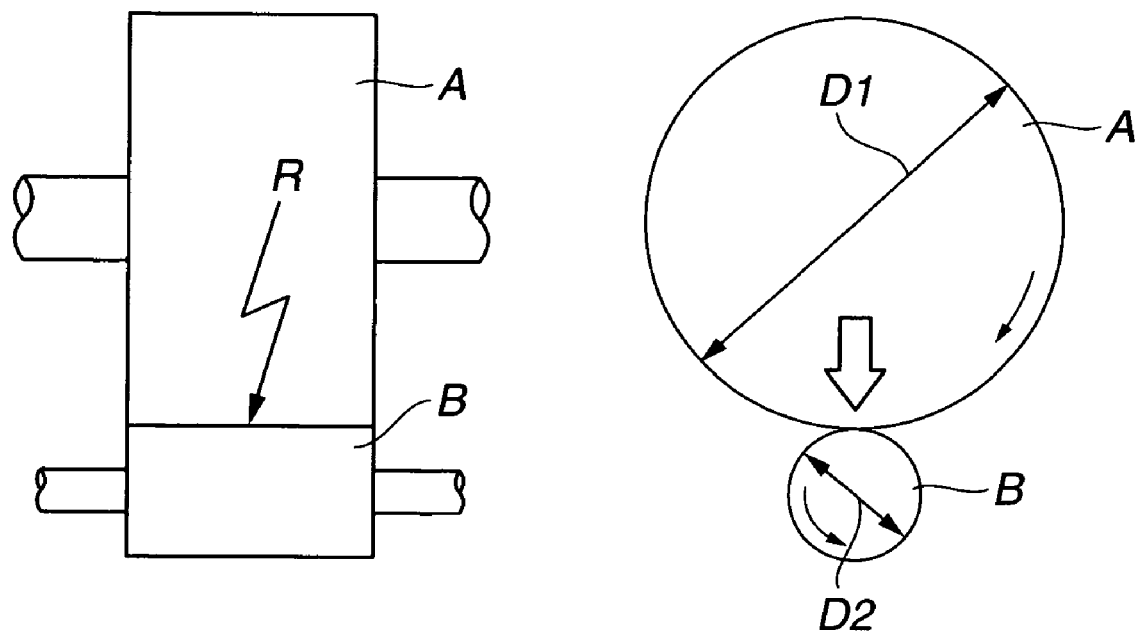
FIG. 1A is a schematic front view of an essential part of an apparatus suitable for practicing a surface strengthening method according to the present invention.
FIG. 1B is a schematic side view of the essential part of the apparatus of FIG. 1A.

FIGS. 1A and 1B illustrate an apparatus for practicing of the surface strengthening method according to the present invention, in which the member having the carbon-based film is illustrated by reference numeral B. In order to strengthen an outer peripheral surface of the film-coated metal member B, it is sufficient that a metal member or roller A is rotated in a condition of being brought into press contact with the outer peripheral surface of the film-coated metal member B while applying a predetermined Hertzian contact pressure on the outer peripheral surface of the film-coated metal member B, as shown in FIGS. 1A and 1B. The predetermined Hertzian contact pressure is not lower than 2.5 GPa.

Here, the Hertzian contact pressure or maximum Hertzian contact pressure ($P_{max}$) is determined, for example, as set forth below, in conditions where the metal member A is formed of a steel (SCM420 in JIS) and has a diameter (D1) of 130 mm and a radius of curvature R of 150 mm on a plane passing through an axis of the metal member A. The film-coated metal member B has a diameter (D2) of 26 mm, and the metal member A is in press contact with the metal member B at a pressure P.

On the basis of the radius of curvature R of the metal member A and the radius of curvature (on a plane passing through an axis) of the film-coated metal member B, a first contact width a and a second contact width b are given by the following equations, the first contact width a being of an elliptical contact portion between the metal member A and the film-coated metal member B and perpendicular to the second contact width b:

The first contact width a:

$a = 0.109 \mu^3 \sqrt{P}$ where $\mu$ is 0.8665

The second contact width b:

$b = 0.109 v^3 \sqrt{P}$ where $v$ is 0.4927

Accordingly, the maximum contact pressure $P_{max}$ (GPa) is given by the following equation:

$P_{max}(GPa) = 3P/2\pi ab.$

Figure 3:
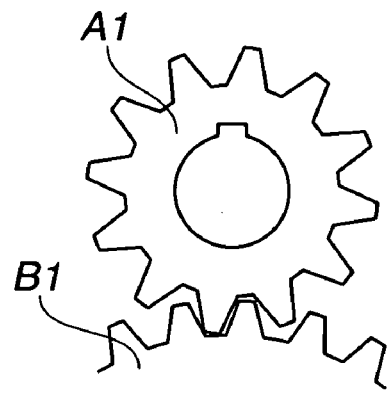
FIG. 3 is a schematic side view of an essential part of another apparatus suitable for practicing the surface strengthening method according to the present invention.

FIG. 3 illustrates another apparatus for practicing the surface strengthening method according to the present invention, in which a gear or metal member A1 is in engagement with a gear or metal member B1 having the carbon-based film. The metal member A1 is rotated applying a predetermined Hertzian contact pressure (of not lower than 2.5 GPa) on the surface of the film-coated metal member B1.

Figure 4:
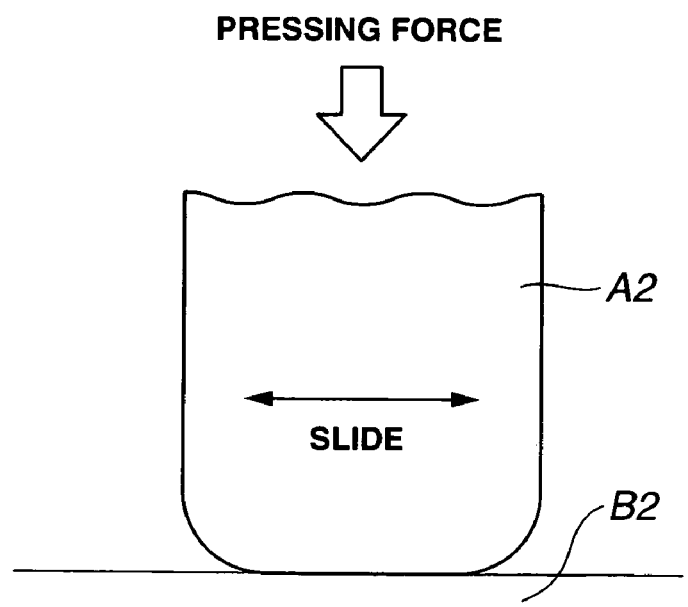
FIG. 4 is a schematic side view of an essential part of a further apparatus suitable for practicing the surface strengthening method according to the present invention.

FIG. 4 illustrates a further apparatus for practicing the surface strengthening method according to the present invention, in which a pressing piece or metal member A2 is in press contact with a metal member B2 having the carbon-based film. The metal member A2 is slidingly moved applying a predetermined Hertzian contact pressure (of not lower than 2.5 GPa) on the flat surface of the film-coated metal member B2.

EXAMPLES

The present invention will be more readily understood with reference to the following Examples and Comparative Examples; however, these Examples are intended to illustrate the invention and are not to be construed to limit the scope of the invention.

(A) Preparation of Specimen (Film-coated Metal Member)

A cylindrical metal member or substrate formed of a steel SCr420 in JIS and having a diameter of 26 mm was subjected to a carburizing treatment. Then, the carburized metal member was coated at its peripheral surface with a film (indicated at the column of kind of film in Table 1) by using a film forming process (indicated in Table 1) at a film forming temperature (indicated in Table 1), thereby preparing a film-coated cylindrical metal member B of each of Examples 1 to 5 or Comparative Example 2. The film had a coefficient of friction, a thickness, and a hardness (Vickers Hardness: Hv) indicated in Table 1. A term CVD indicated in Table 1 represents Chemical Vapor Deposition. A cylindrical metal member B of Comparative Example 1 was the cylindrical metal material itself and therefore not coated with the film.

TABLE 1

| No. | Film forming process | Coefficient of friction of film | Kind of film | Thickness of film (μm) | Film forming temperature (° C.) | Hardness of film (Hv) |
|---|---|---|---|---|---|---|
| Example 1 | Plasma CVD | 0.2 | DLC | 0.68 | 230 | 2400 |
| Example 2 | Plasma CVD | 0.2 | DLC | 0.2 | 220 | 2000 |
| Example 3 | Plasma CVD | 0.2 | DLC | 1.1 | 220 | 2000 |
| Example 4 | Plasma CVD | 0.2 | DLC | 1.1 | 210 | 1500 |
| Example 5 | PVD | 0.2 | DLC | 1.2 | 200 | 3000 |
| Comparative Example 1 | — | — | None | — | — | — |
| Comparative Example 2 | PVD | 0.6 | TiN | 2.5 | 450 | 1800 |

(B) Experiment

A cylindrical metal member or roller A shown in FIGS. 1A and 1B was contacted with and rotated on the outer peripheral surface of the film-coated metal member B of each Example or Comparative Example while applying the Hertzian contact pressure on the peripheral surface of the film-coated metal member B, in which the outer peripheral surface of the film-coated metal member B was strengthened and a roller pitting test was conducted to examine a pitting resistance of the strengthened metal member B. In this experiment, the metal member A was made of a material SUJ2 in JIS and has a diameter of 130 mm and a radius of curvature R of 150 mm on a plane passing through an axis of the metal member A. In the experiment, the metal member A was rotated at 1500 r.p.m. under lubrication using a lubricating oil with a slip rate of 60% to the film-coated metal member B. The lubricant oil had a temperature of 90° C. and was supplied at a rate of 2 lit./min. The above slip rate was given by the following equation: Slip rate (%)=(V−V')/V×100 where V is a peripheral velocity of the metal member A, and V' is a peripheral velocity of the metal member B. Then, the number of cycles (rotations) of the film-coated metal member B was counted until pitting or crack was formed at the surface portion of the film-coated metal member B. The above experiment was carried out a plurality of times, varying the maximum Hertzian contact pressure, for the metal member B of each Examples and Comparative Examples. This experiment provided a plurality of experimental data which were plotted as a line as shown in FIG. 2.

Figure 2:
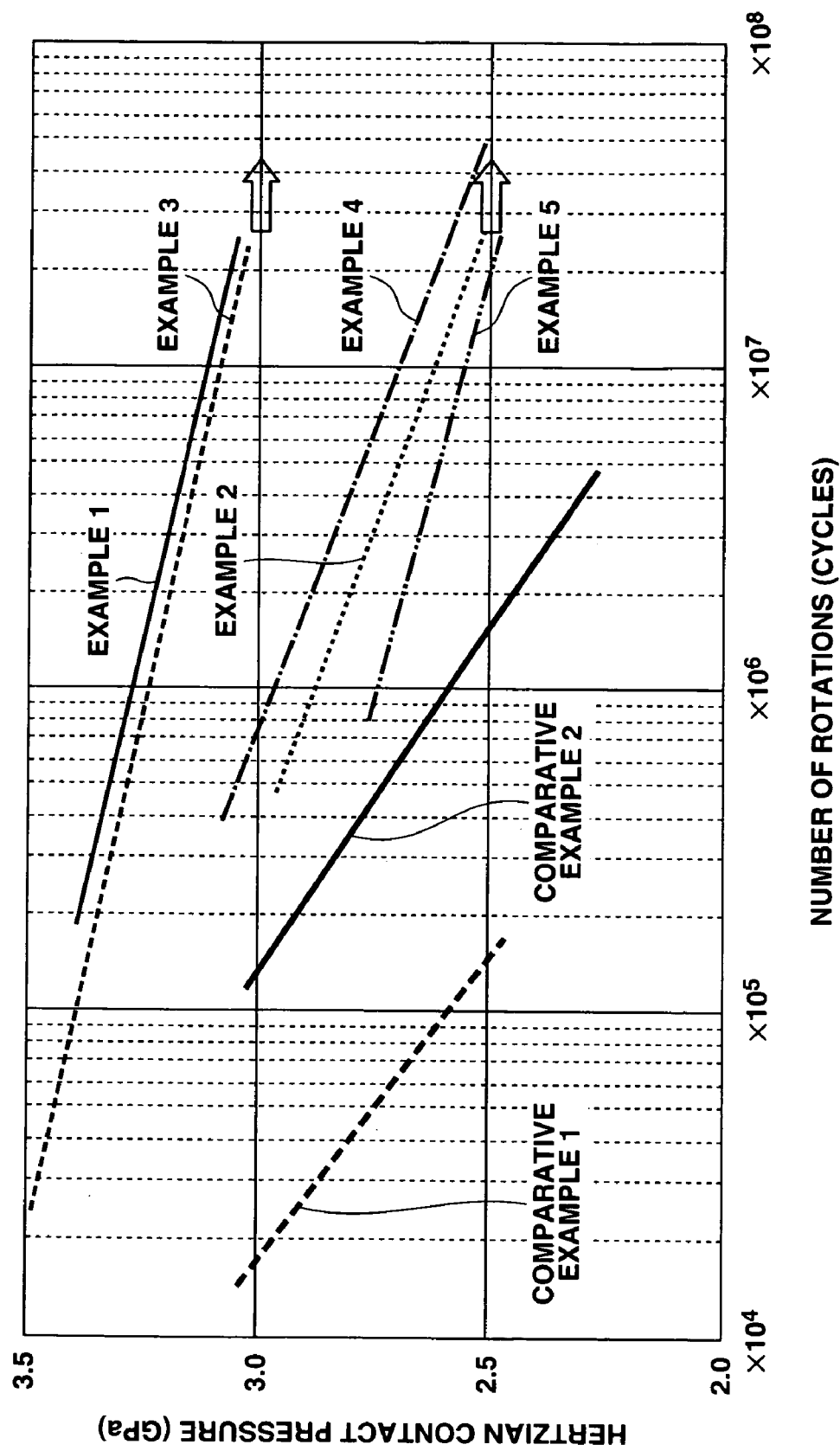
FIG. 2 is a graph of experimental data taken by using the apparatus in FIGS. 1A and 1B, showing a relationship between a Hertzian contact pressure and the number of cycles (or rotations)

In FIG. 2, lines indicated as Examples 1, 2, 3, 4 and 5 and Comparative Examples 1 and 2 are respectively the experimental data of Examples 1, 2, 3, 4 and 5 and Comparative Examples 1 and 2 shown in Table 1. The metal member B of Comparative Example 1 had no film at the peripheral surface of the cylindrical metal member of the steel SCr420.

The experimental data reveal that the metal members of Examples 1 to 5 tend to raise the limit of occurrence of crack (originated in a surface layer or an inside of the metal member) in pressure and/or number of cycles (rotations) as compared with Comparative Examples 1 and 2. In other words, the film-coated metal members of Examples 1 to 5 are found to be improved in pitting resistance as compared with Comparative Examples 1 and 2.

According to the present invention, a pressing force is repeatedly applied to the surface of the film-coated metal member in such a manner that the surface of the film-coated metal member is subjected to the Hertzian contact pressure of not lower than 2.5 Gpa. With this, a microstructure (or a structure on a scale of nanometer) having an average grain size of not larger than 1 μm is formed at the surface of the film-coated metal member, so that the film-coated metal member is greatly improved in mechanical strength and wear resistance. In order to repeatedly apply the pressing force to the surface of the film-coated metal member, it is sufficient that the roller is rotated in a condition of being brought into press contact with the film-coated metal member. Otherwise, it is sufficient that the pressing piece is slidingly moved in a condition of being brought into press contact with the film-coated metal member. Therefore, a large-scale facility is not needed, and additionally the metal member can be strengthened only at its specified portion. Furthermore, the present invention makes it possible to stably provide a metal member having a surface excellent in mechanical strength.

The entire contents of Japanese Patent Applications P2005-196160 (filed Jul. 5, 2005) and P2006-115991 (filed Apr. 19, 2006) are incorporated herein by reference.

Although the invention has been described above by reference to certain embodiments and examples of the invention, the invention is not limited to the embodiments and examples described above. Modifications and variations of the embodiments and examples described above will occur to those skilled in the art, in light of the above teachings. The scope of the Invention is defined with reference to the following claims.

What is claimed is:

1. A method for strengthening a surface of a metal member, comprising the following steps in the sequence set forth:
   coating the surface of the metal member with a DLC film having a thickness of not smaller than 0.2 μm; and
   applying a pressing force onto the surface of the film-coated metal member by rotating a single roller on the film-coated metal member until a portion of the surface of the film-coated metal member repeatedly receives the pressing force from the single roller to have a press contact with the film-coated metal member and to maintain a contact pressure of not lower than 2.5 GPa at the portion of the surface of the film-coated metal member, when the pressing force is applied at the portion of the surface of the film-coated metal member.

2. A method as claimed in claim 1, wherein the DLC film has a coefficient of friction of lower than 0.6.

3. A method as claimed in claim 1, wherein the contact pressure is a Hertzian contact pressure.

4. A method as claimed in claim 3, wherein the Hertzian contact pressure is maximum Hertzian contact pressure.

5. A method for strengthening a surface of a cylindrical metal member, comprising the following steps in the sequence set forth:
   coating the surface of the cylindrical metal member with a DLC film having a thickness of not smaller than 0.2 μm; and
   bringing a single roller into press contact with the surface of the film-coated cylindrical metal member and rotating the single roller until a portion of the surface of the film-coated cylindrical metal member repeatedly receives a pressing force from the single roller in a condition of maintaining a Hertzian contact pressure of not lower than 2.5 GPa at the portion of the surface of the film-coated cylindrical metal member when the pressing force is applied at the portion of the surface of the film-coated cylindrical metal member.

6. A method as claimed in claim 1, wherein the single roller is rotated on the film-coated metal member until a microstructure having an average grain size of not larger than 1 μm is formed at the portion of the surface of the film-coated metal member.

7. A method as claimed in claim 5, wherein the single roller is rotated until a microstructure having an average grain size of not larger than 1 μm is formed at the portion of the surface of the film-coated metal member.

* * * * *